(12) United States Patent
Wallace et al.

(10) Patent No.: US 9,303,953 B2
(45) Date of Patent: Apr. 5, 2016

(54) DIGITAL SYSTEM FOR THE DETECTION OF VARIATIONS IN OPERATING CONDITIONS OF AN INTEGRATED CIRCUIT

(71) Applicant: TEXAS INSTRUMENTS INCORPORATED, Dallas, TX (US)

(72) Inventors: William C Wallace, Richardson, TX (US); Alok Anand, Bangalore (IN); Ravi Srivaths, IndiraNagar Bangalore (IN); Chillara Kiran Kumar, Bangalore (IN); Aruna Koityar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 549 days.

(21) Appl. No.: 13/757,931

(22) Filed: Feb. 4, 2013

(65) Prior Publication Data

US 2013/0241690 A1   Sep. 19, 2013

Related U.S. Application Data

(60) Provisional application No. 61/611,052, filed on Mar. 15, 2012.

(51) Int. Cl.
*G01R 11/24* (2006.01)
*F41G 1/38* (2006.01)
*G05B 1/01* (2006.01)
*F41G 1/387* (2006.01)
*H01L 23/00* (2006.01)

(52) U.S. Cl.
CPC .... *F41G 1/38* (2013.01); *F41G 1/387* (2013.01); *G05B 1/01* (2013.01); *H01L 23/576* (2013.01); *H01L 2924/0002* (2013.01); *Y10T 29/49826* (2015.01)

(58) Field of Classification Search
CPC ........ G01R 23/14; G01R 23/145; G01R 23/15; G01R 23/00; G01R 23/02
USPC .......... 340/3.1, 3.43; 327/20, 113; 716/108, 716/112, 113, 6
See application file for complete search history.

(56) References Cited

U.S. PATENT DOCUMENTS

2007/0069875 A1*  3/2007  Doi ............................. 340/440
2010/0182055 A1*  7/2010  Rozen et al. ................. 327/155
2011/0175658 A1*  7/2011  Nomura ....................... 327/261

* cited by examiner

*Primary Examiner* — Son Le
(74) *Attorney, Agent, or Firm* — Robert D. Marshall, Jr.; Frank D. Cimino

(57) ABSTRACT

A system for detecting tamper events in a digital circuit by having a Critical Path Replica (CPR) circuit operable in parallel with the circuit being monitored, and adjusted to generate a timing violation if the operating parameters of the circuit change to be outside the normal operating parameters. The critical path replica circuit is adjusted to generate a timing violation before the actual circuit being monitored fails due to the changed operating parameters.

10 Claims, 2 Drawing Sheets

DIGITAL SYSTEM FOR THE DETECTION OF VARIATIONS IN OPERATING CONDITIONS OF AN INTEGRATED CIRCUIT

CLAIM OF PRIORITY

This application claims priority under 35 U.S.C. 119(e)(1) to Provisional Application No. 61/611,052 filed 15 Mar. 2012.

TECHNICAL FIELD OF THE INVENTION

The technical field of this invention is detection of variations in operating conditions of an integrated circuit.

BACKGROUND OF THE INVENTION

System-on-Chips (SoCs) that go into payment terminals, e-passport, smart phones, smartcards, energy metering and other such secure embedded systems need to have a means of detecting and self-protecting against a tamper event. A tamper event is defined as any change in the environment under which the SoC is operating that may lead to an operational failure and in turn, possible leakage of sensitive/secure information. A change in the device operating voltage, frequency or temperature beyond the specified range is considered a tamper event.

SUMMARY OF THE INVENTION

This invention describes a simple in-circuit means of detecting a tamper event caused by a change in voltage, temperature or frequency of operation. It is based on a critical path tracker or replica (CPR) circuit that duplicates one or more critical paths in the SOC and which can detect voltage, temperature and frequency tamper.

BRIEF DESCRIPTION OF THE DRAWINGS

These and other aspects of this invention are illustrated in the drawings, in which.

DETAILED DESCRIPTION OF PREFERRED EMBODIMENTS

Any change in voltage or temperature affects the delay of the gates used in a design. On a critical path, if the change goes beyond specifications then the change in delay will cause the circuit to fail. On a critical path, an increase in frequency beyond specifications similarly causes failure of the circuit. The described invention detects the critical path failures caused by deviations of voltage, temperature, or frequency beyond specifications which will cause timing violations. Two types of timing violations are detected, namely setup and hold type.

The critical path replica circuit will "mimic" the critical path and hence, would also fail in the above scenario. This failure in the critical path replica is detected as a tamper event used to trigger any tamper response mechanisms such as chip reset. A critical aspect of critical path replica circuit design is ensuring that it fails ahead of the actual critical path in the design. Our invention also includes a judicious margin based methodology that enables the critical path replica circuit to fail ahead of the actual design. Thus, by detecting the tamper event earlier than actual design failure, the critical path replica can be used to protect the SOC.

The critical path replica consists of a waveform generator and a capture register which captures this waveform. The waveform is faithfully captured as it passes through the CPR delays as long as the critical path replica is within the operating voltage, temperature and frequency ranges of the design. Once there is a tamper event and any of the above parameters are out of spec, the waveform is no longer captured correctly. This incorrect capture of the waveform is detected and is used to preset the register. The register signals the tamper event and can be used to protect the design.

Figure 1:
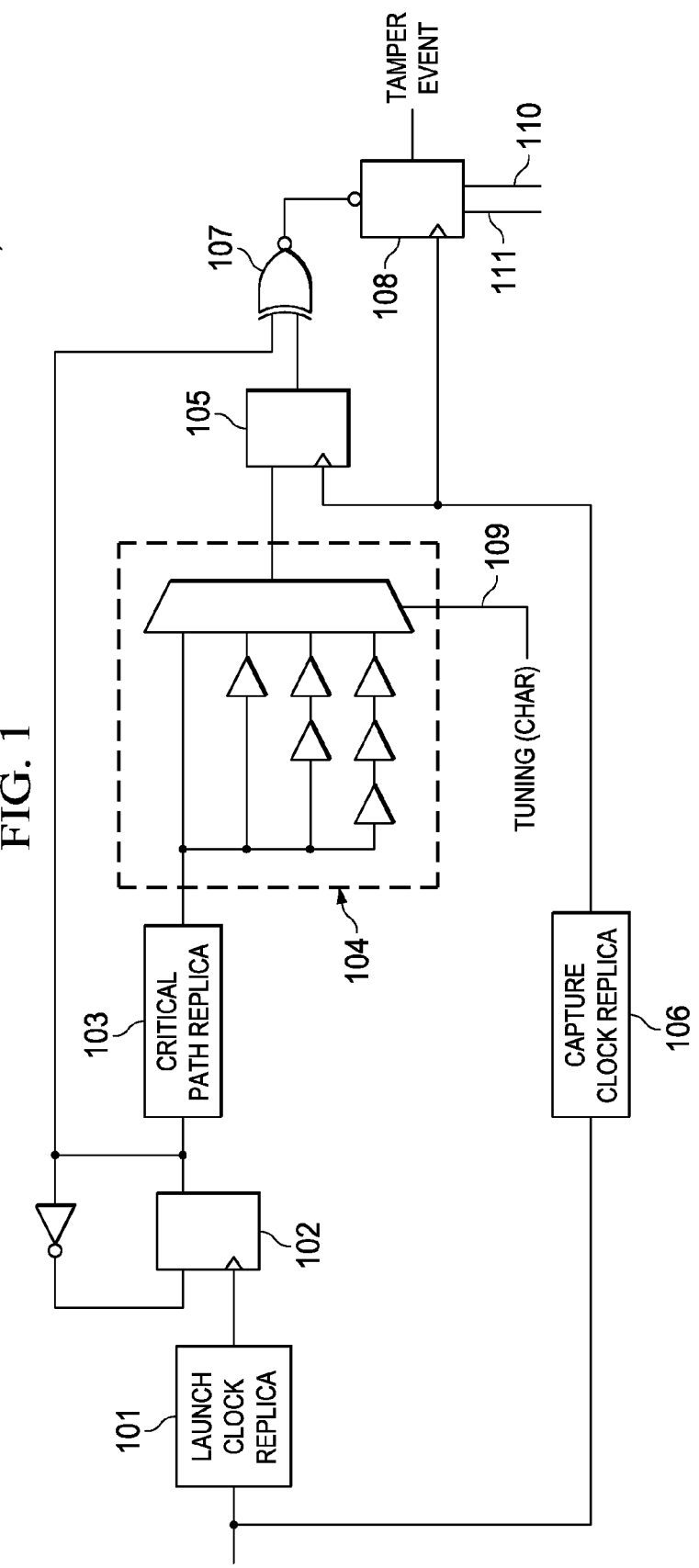
FIG. 1 illustrates the setup CPR circuit.

FIG. 1 illustrates one implementation of the setup fault CPOR circuit. This will detect tamper events caused by the voltage going below normal operating range, the operating frequency going above normal operating range, and when the temperature going above the normal operating range.

Operation is initiated by launch clock replica 101 and waveform generator 102. The generated waveform passes through the critical path replica block 103, tuning multiplexer 104, and is captured by register 105 upon the replica capture clock originating in block 106. The delay of block 104 is controlled by tuning multiplexer select signal 109, as shown in Table 1.

TABLE 1

| | | | |
|---|---|---|---|
| LAUNCH_CLOCK | IN | | Functional Clock of the critical path launch flop |
| CAPTURE_CLOCK | IN | | Functional Clock of the critical path capture flop |
| RESETN | IN | | Functional Reset of the critical path |
| TUNING_MUX_SEL[4:0] | IN | | Tuning Mux Control 0000—Zero Delay 0001—Delay 1 0010—Delay 2 1111—Delay 3 |
| TAMPER_EVENT | OUT | | Tamper Event |
| TESTMODE | IN | | Test Mode |

The value captured in register 105 is compared with the output of register 102 in XNOR 107. Counter 108 is a programmable counter that may be preset to a count value through line 111. Counter 108 is incremented by the output of XNOR 107 whenever a mismatch is detected in 107. Counter 108 is periodically reset by control line 110. A counter 108 overflow is indicated as a tamper event.

Figure 2:
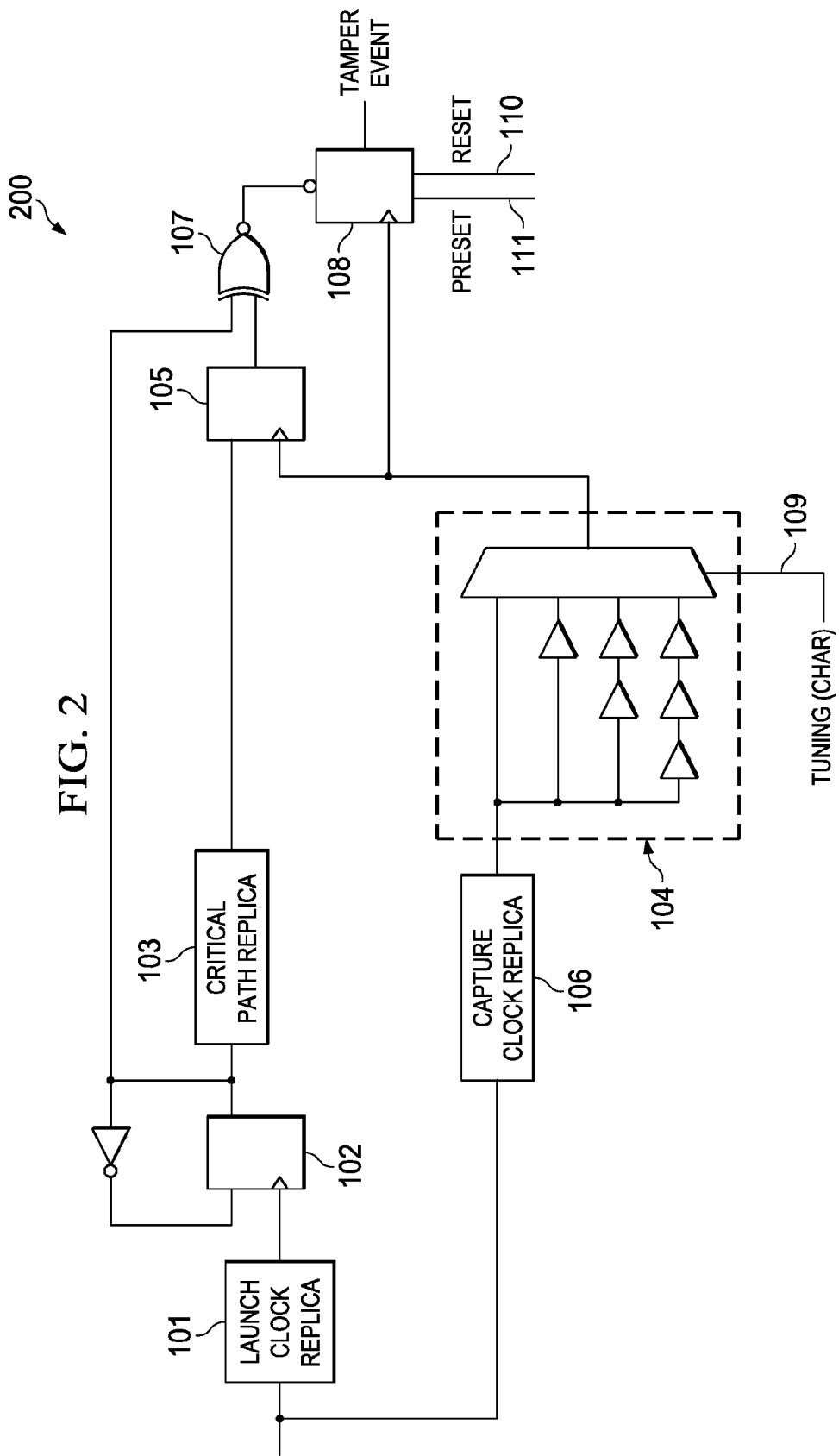
FIG. 2 illustrates the hold CPR circuit.

FIG. 2 shows an implementation of the hold CPR circuit. This circuit will indicate a tamper fault if the voltage is above the normal operating range, or if the temperature is below the normal operating range. The operation of the circuit in FIG. 2 is similar to that of in FIG. 1, with the exception that the replica capture clock is being delayed by the tuning multiplexer instead of the data from the data path replica as in FIG. 1.

Since the CPR relies on the correlation between the real critical path and the replica, the CPR needs to be placed physically close to the actual critical path in the design. This will also ensure that the IR drop seen by the actual critical path cells is also seen by the CPR.

If there are multiple critical paths in the design, there can be multiple instantiations of the CPR.

It is also recommended to have 1 (setup+hold) CPR per clock domain.

The tamper events from each of these individual CPR implementations would be ORRed and used as an overall indication of a tamper event.

The CPR implementation must detect the tamper condition and signal the tamper event before any of the actual digital logic in the SOC sees the effect of the tamper. Therefore it is important to make sure that the CPR fails setup/hold earlier than the actual critical path in the design.

The tuning multiplexer in the critical path has the capability of introducing additional delay components in the critical path. The granularity of the delay element can be chosen according to an application—as an example, it may be in increments of 10 ps. By default, the delay will be zero.

For the CPR to detect the tamper event faithfully, it needs to have good correlation with the design critical path. There are some effects, which are hard to model in static timing analysis and could lead to weak correlation on Silicon. The CPR needs to have a guard band margin for such effects. Some of the key factors to consider are:

Design of the replica critical path co-relation to what is seen on Silicon as critical path
Variation due to differential aging effects
Variation due to dynamic IR drop differences
Variation due to crosstalk effects In addition, the margin also needs to comprehend the inaccuracy of the CPR detection circuit. In the setup+hold window of the capture register, the capture can be unpredictable due to metastability effects.

In summary, a delay margin comprehending all of the above factors must be introduced in the CPR to make sure that the CPR fails ahead of the design critical path under tamper condition.

This margin is introduced through configurable delay elements in the tuning multiplexer.

What is claimed is:

1. A tamper detection system comprising:
   a launch clock replica circuit receiving a clock signal at an input and generating a launch clock signal at an output;
   a waveform generator register having a latch input connected to said output of said launch clock replica, an input and an output;
   an inverter having an input connected to said output of said waveform generator and an output connected to said input of said waveform generator;
   a critical path replica circuit having an input connected to said output of said waveform generator and an output, said critical path replica circuit having a delay corresponding to a delay of a critical path of a circuit to be protected;
   a variable delay circuit having an input connected to said output of said critical path replica circuit and an output, said variable delay circuit having a specified delay;
   a capture clock replica circuit receiving a clock signal at an input and generating a capture clock signal at an output;
   a register having a latch input connected to said output of said capture clock replica circuit, an input connected to said output of said variable delay circuit and an output;
   an exclusive NOR gate having a first input connected to said output of said waveform generator, a second input connected to said output of said register and an output;
   a counter having an enable input connected to said output of said exclusive NOR gate, a clock input connected to said output of said capture clock replica circuit and an overflow output, said counter counting clock signals at said clock input when said exclusive NOR indicates said output of said waveform generator does not match said output of said register and generating an overflow signal at said overflow output indicating tampering upon overflow.

2. The tamper detection system of claim 1, wherein:
said critical path replica circuit is disposed physically close to said critical path of said circuit to be protected.

3. The tamper detection system of claim 1, wherein:
said delay of said variable delay circuit is selected whereby said counter indicates overflow before said critical path of said circuit to be protected fails.

4. The tamper detection system of claim 1, wherein:
said counter includes a reset input and is periodically reset.

5. The tamper detection system of claim 1, wherein:
said counter includes a count input for receiving a predetermined count.

6. A tamper detection system comprising:
   a launch clock replica circuit receiving a clock signal at an input and generating a launch clock signal at an output;
   a waveform generator register having a latch input connected to said output of said launch clock replica circuit, an input and an output;
   an inverter having an input connected to said output of said waveform generator and an output connected to said input of said waveform generator;
   a critical path replica circuit having an input connected to said output of said waveform generator and an output, said critical path replica circuit having a delay corresponding to a delay of a critical path of a circuit to be protected;
   a capture clock replica circuit receiving a clock signal at an input and generating a capture clock signal at an output;
   a variable delay circuit having an input connected to said output of said capture clock replica circuit and an output, said variable delay circuit having a specified delay;
   a register having a latch input connected to said output of said variable delay circuit, an input connected to said output of said critical path replica circuit and an output;
   an exclusive NOR gate having a first input connected to said output of said waveform generator, a second input connected to said output of said register and an output;
   a counter having an enable input connected to said output of said exclusive NOR gate, a clock input connected to said output of said capture clock replica circuit and an overflow output, said counter counting clock signals at said clock input when said exclusive NOR indicates said output of said waveform generator does not match said output of said register and generating an overflow signal at said overflow output indicating tampering upon overflow.

7. The tamper detection system of claim 6, wherein:
said critical path replica circuit is disposed physically close to said critical path of said circuit to be protected.

8. The tamper detection system of claim 6, wherein:
said delay of said variable delay circuit is selected whereby said counter indicates overflow before said critical path of said circuit to be protected fails.

9. The tamper detection system of claim 6, wherein:
said counter includes a reset input and is periodically reset.

10. The tamper detection system of claim 6, wherein:
said counter includes a count input for receiving a predetermined count.

* * * * *